(12) United States Patent
Romanato et al.

(10) Patent No.: US 7,588,882 B2
(45) Date of Patent: Sep. 15, 2009

(54) METHOD FOR FABRICATING COMPLEX THREE-DIMENSIONAL STRUCTURES ON THE SUBMICROMETRIC SCALE BY COMBINED LITHOGRAPHY OF TWO RESISTS

(75) Inventors: Filippo Romanato, Trieste (IT); Enzo Di Fabrizio, Trieste (IT); Rakesh Kumar, Chandigarh (IN)

(73) Assignee: INFM Instituto Nazionale per La Fisica Della Materia, Genoa (IT)

( * ) Notice: Subject to any disclaimer, the term of this patent is extended or adjusted under 35 U.S.C. 154(b) by 796 days.

(21) Appl. No.: 10/945,897

(22) Filed: Sep. 22, 2004

(65) Prior Publication Data

US 2005/0064343 A1 Mar. 24, 2005

(30) Foreign Application Priority Data

Sep. 23, 2003 (IT) .......................... TO2003A0730

(51) Int. Cl.
*H01L 21/02* (2006.01)
(52) U.S. Cl. ........................ 430/312; 430/313; 430/394
(58) Field of Classification Search ........................ None
See application file for complete search history.

(56) References Cited

U.S. PATENT DOCUMENTS

| 5,407,782 | A | * | 4/1995 | Kobayashi ................ 430/273.1 |
| 5,641,591 | A | * | 6/1997 | Kawakami et al. ....... 429/231.5 |
| 5,656,414 | A |   | 8/1997 | Chou et al. |
| 5,719,009 | A |   | 2/1998 | Fan |
| 6,113,449 | A | * | 9/2000 | Sung et al. ..................... 445/24 |
| 2003/0002846 | A1 |   | 1/2003 | Sigalas |
| 2003/0054578 | A1 |   | 3/2003 | Behfar et al. |

FOREIGN PATENT DOCUMENTS

| EP | 0154979 A2 | 9/1985 |
| EP | 0269219 A2 | 6/1988 |
| EP | 0405585 A2 | 1/1991 |
| EP | 1489460 A2 | 12/2004 |
| JP | 60-091639 A | 5/1985 |
| WO | WO 0210857 A2 | 2/2002 |

* cited by examiner

*Primary Examiner*—John A McPherson
*Assistant Examiner*—Daborah Chacko Davis
(74) *Attorney, Agent, or Firm*—Sughrue Mion, PLLC

(57) ABSTRACT

What is described is a lithographic method for fabricating three-dimensional structures on the micrometric and submicro-metric scale, including the operations of: depositing a layer of a first resist on a substrate; depositing a layer of a second resist on the layer of the first resist; forming a pattern of the second resist by lithography; depositing a further layer of the first resist on the previous layers; and forming a pattern of the first resist by lithography. The second resist is sensitive to exposure to charged particles or to electromagnetic radiation in a different way from the first; in other words, it is transparent to the particles or to the electromagnetic radiation to which the first resist is sensitive, and therefore the processes of exposure and development of the two resists are mutually incompatible to the extent that the exposure and development of one does not interfere with the exposure and development of the other.

13 Claims, 5 Drawing Sheets

METHOD FOR FABRICATING COMPLEX THREE-DIMENSIONAL STRUCTURES ON THE SUBMICROMETRIC SCALE BY COMBINED LITHOGRAPHY OF TWO RESISTS

BACKGROUND OF THE INVENTION

The present invention relates in general to a lithographic method for fabricating three-dimensional structures on the micrometric and submicrometric scale.

The method in question can be applied to the combined fabrication of ordered or single three-dimensional submicrometric structures comprising within themselves further lithographic structures which could not otherwise be inserted or produced by other lithographic processes. In particular, the latter can consist of regions of irregularities in periodic structures, such as point, line, surface or volume defects.

The method can also be used for forming structures suspended from other complex three-dimensional structures.

The method provides a tool for overcoming some of the present limitations of the production of three-dimensional structures based on the ordinary layer-by-layer lithographic processes which encounter difficulties in the generation of concave shapes, in the opening of voids within lithographic super-structures, or in the simple generation of suspended structures.

The technologies for fabricating complex three-dimensional nanostructures are particularly important in various fields of application, including: photonics, in which they are used for forming photonic crystals and corresponding interconnection networks for optical signals; optics, in which they are used for fabricating diffractive optical elements; microfluidics, in which they are used for fabricating elements for micro-devices for medical and biological use and micro-implants, and for the production of electromechanical and/or electrochemical microsensors and microsystems.

These are disciplines which require the development of highly complex devices in which the typical lateral topology of the layer-by-layer lithographic procedure is no longer adequate, and the development of complex three-dimensional micro- and nanometric structures is also required. Regions of irregularity, buried structures, cavities and concavities, and defects incorporated in regular volume structures, in particular line defects, can be used to form and bring into a functional state these devices and the structures of which they consist.

The following description will be focused on the technological aspect of the fabrication of photonic crystals and microfluidic mixers, providing a typical example of a complex structure which can be formed by the new lithographic method.

Photonic crystals are artificial structures with a periodic structure, which can wholly or partially absorb and/or confine electromagnetic radiation within a given frequency range. In terms of geometry, they can be period along one-, two- or three-dimensions. The last-mentioned type has the property of confining electromagnetic radiation in all directions, and therefore plays a key role in the transmission of light signals and of an electromagnetic wave in general.

However, effective transmission of the signal requires not only the presence of the three-dimensional photonic crystal, but also a network of interconnections, such as a waveguide network, filters, resonant cavities, and similar circuits for transmitting and/or processing electromagnetic signals, capable of carrying optical radiation within the 3D structure. Other passive devices may take the form of optical signal filters, combiners and/or differentiators. The possibility of forming optical cavities also becomes essential for the fabrication of innovative active devices (in other words, those capable of generating light signals) such as lasers with low activation thresholds. What is required, therefore, is a technology for designing and forming line and volume defects within these crystals, and for positioning the defects precisely with respect to the periodic structure of the crystals.

At the present time, the fabrication of a 3D photonic crystal comprising waveguides or other active or passive optical circuit elements is one of the problems limiting the development of photonics.

In terms of methods, a distinction is made in the prior art between two categories of procedure for forming three-dimensional periodic nanostructures, particularly those incorporating internal defects. On the one hand, there are known sequential processes such as the aforementioned layer-by-layer or point-by-point processes, which permit precise control of the fabrication of the structure and consequently of the generation of defects within it. These processes are very inefficient and expensive, and therefore unsuitable for mass production, or even for research in some cases. On the other hand, there are known parallel processes (such as nanoparticle self-assembly, holographic lithography, and X-ray lithography processes) which intrinsically provide for three-dimensional fabrication and are therefore suitable for mass production, but cannot be used to form defects, and therefore, in the case in question, cannot be used to form an interconnection network for the transmission of light signals in a photonic crystal.

The two procedures are complementary to each other. Control of the detail permits the design of the waveguides, but not of the photonic crystal structure; conversely, the generation of volumes with a three-dimensional structure does not permit the control of the generation of defects within them.

U.S. Patent Application US2003/0002846 to Sigalas, under the title "Three dimensional photonic crystal waveguide apparatus", describes a standard layer-by-layer fabrication method. Periodic structures which are obliged to develop within a plane are generated in each layer. The operation is repeated with alignments of the subsequent layers to form the three-dimensional structure. During the fabrication of a single layer, a single line defect is formed in the planar periodic structure, this defect being buried subsequently by the deposition of the subsequent layers.

The drawback of the layer-by-layer procedure described above is that it requires numerous lithography steps and process steps for the creation of the photonic crystal and of the defect incorporated in the volume of the crystal, and is therefore slow and expensive and thus unsuitable for mass production.

Parallel or self-assembly procedures have complementary properties. These procedures make use of chemical and/or physical phenomena (nanosphere packing, interference of coherent light beams, ion beam deposition, etc.) to generate intrinsically periodic 3D structures. The formation of the photonic crystal is usually completed by the infiltration of dielectric material with a high refractive index through the interconnected pores of the periodic structure which has been generated. The nature of parallel procedures is such that they cannot generate the anomaly required for the generation of a line or volume defect with controlled geometry.

X-ray lithography also belongs to the category of parallel procedures for forming photonic crystals. According to procedures described previously, the superimposition of a series of parallel beams originating from different directions enables a three-dimensional ordered periodic structure to be generated. In this case also, it is necessary to find an innovative method for introducing the defects into the photonic crystal.

To facilitate the understanding of a typical lithographic process for fabricating three-dimensional nanostructures according to the prior art, reference will be made to FIGS. 1a-1e which show schematically the steps of fabrication of a general photonic crystal structure. This relates to the case of X-ray lithography as an example of parallel lithographic process.

FIG. 1a shows an initial configuration comprising a substrate S on which a layer L of a resist R, for example a photosensitive or X-ray sensitive resin, has been deposited. In FIGS. 1b and 1c, the resist R is illuminated by a radiation X through a mask M. In this case, the resist is exposed in successive steps with different directions of incidence, in which the radiation strikes the structure at different angles. In the present example, a positive resist has been used, and therefore in the illuminated regions (forming the lattice G in the figure) the molecular bonds of the resist are broken, and the resist is removed by means of a suitable solvent.

In a subsequent step (FIG. 1d), a metal is electrolytically grown inside the hollow reticular structure G created in the unexposed volume of positive resist. The removal of the undeveloped volume of resist (FIG. 1e) produces the final desired three-dimensional metallic structure, in this case a periodic lattice of interlocking metallic columns supported by the substrate S. The step of infiltration of the metal can be replaced or followed by infiltration of dielectric materials by the sol-gel method, or by chemical deposition of dielectric materials from the vapour phase or liquid phase, in order to produce purely dielectric or combined metal-dielectric photonic crystals.

With reference to FIGS. 2a-2h, these show schematically, in sequence, a process for forming a defect within a periodic three-dimensional structure according to the described method.

Steps 2a-2c are identical to steps 1a-1c described previously. A first layer L1 of positive resist R is deposited on a substrate S, and the resist is then illuminated (by X-rays, for example) through a mask M in the desired directions. Thus a reticular structure G of un-polymerized resist, embedded in a volume of stable resist, is created in the body of the resist.

In step 2d, the structure thus obtained is exposed to a further lithographic process, for example electron beam lithography (a process which, as such requires no further masking), to form a surface region D of limited extent, representing the defect to be produced in the photonic crystal being fabricated.

In the next step (FIG. 2e), after removal of the un-polymerized resist, the electrolytic growth of metal is carried out within the reticular structure G.

In the next step (FIG. 2f), a second layer L2 of the same resist R is deposited on the intermediate structure thus formed, and a further step of X-ray lithography is carried out (FIG. 2g) in the same way as before (FIGS. 2b and 2c) to create a further reticular structure G' of un-polymerized resist which is then removed.

The process is completed with the metallization of the hollow reticular structure G' in the upper layer L2 of the total volume of resist, thus producing a three-dimensional photonic crystal structure incorporating the defect D within it (FIG. 2h).

Clearly, the defect can be a zero-dimensional, one-dimensional (line defect), two-dimensional or three-dimensional defect, depending on the surface region exposed to electron beam lithography.

This combination of X-ray lithography and electron beam lithography is generally advantageous. It combines the possibility of using a parallel production method (X-ray lithography) with the minimum of necessary layers, and therefore the minimum of necessary process steps, to introduce the defect. However, it has a number of drawbacks.

One of these is due to the fact that the volume of the final structure is obtained by superimposing two layers of the resist at whose interfaces the defect has been created, and the overall periodic structure forming the photonic crystal is produced at different times in these layers. This leads to an alignment problem among the upper periodic structure of the crystal and the lower structure, due to the difficulty of correctly aligning the masks used in the two steps of X-ray lithography, carried out before and after the formation of the defect, respectively. This problem arises whenever two, or more, distinct lithographic processes for the generation of the lattices in the two layers L1 and L2 are used.

SUMMARY OF THE INVENTION

Moreover, the defect introduced into the crystal structure has to be substantially planar, as otherwise the steps shown in FIGS. 2d-2h would have to be repeated several times, which would greatly increase fabrication costs and times. In fact, in the example shown above, the process described in FIGS. 2g and 2h is completely disconnected from the preceding process steps.

The object of the present invention is to provide a method for fabricating micrometric and sub-micrometric three-dimensional structures which overcomes the drawbacks of the known art. The method is also required to be suitable for mass production for the widest range of end applications.

To summarize, the method according to the invention is based on the combined use of two resists, whose configuration processes (patterning) are independent of each other; in other words, their chemical properties determining the conditions of exposure and development are incompatible to the extent that the exposure and development process of one does not interfere with the exposure and development process of the other.

BRIEF DESCRIPTION OF THE DRAWINGS

Further characteristics and advantages of the invention will be disclosed more fully in the following detailed description of one embodiment of the invention, provided by way of non-limitative example, with reference to the attached drawings, in which.

DETAILED DESCRIPTION OF THE INVENTION

In FIGS. 3a-3g, elements identical or functionally equivalent to those shown in the preceding figures are indicated by the same references used previously in the description of those figures.

In the following description, reference will be made to a method for fabricating three-dimensional photonic crystals and the interconnection network (waveguides) for carrying an optical signal within the crystal. Clearly, the following description can also be extended to other fields of application in which complex 3D microsystems or nanosystems have to be produced, for example, as mentioned above, for the fabrication of diffractive optical elements or elements for microfluidics, microsensors and electromechanical microsystems.

Figure 1A:
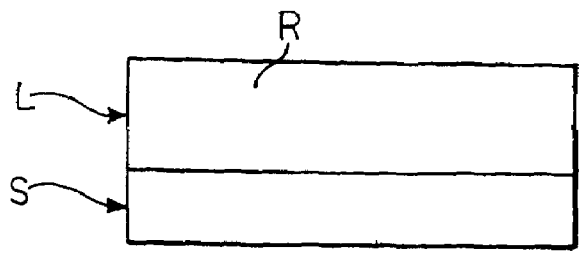
FIGS. 1a-1e, 2a-2h represent the prior art and have already been commented on in the introductory part of the present description.
Figure 1B:
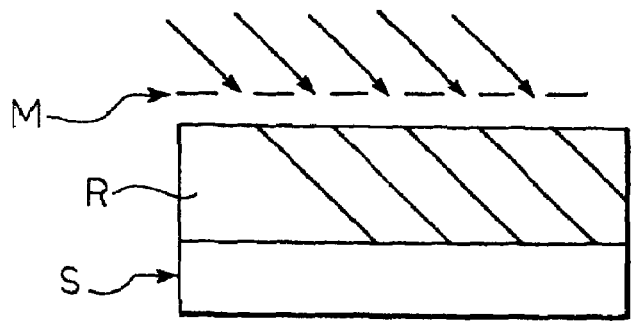
Figure 1C:
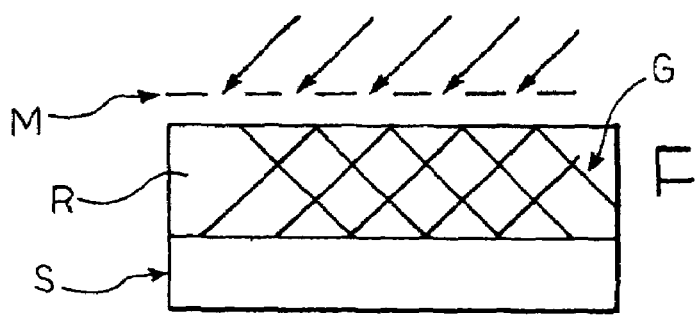
Figure 1D:
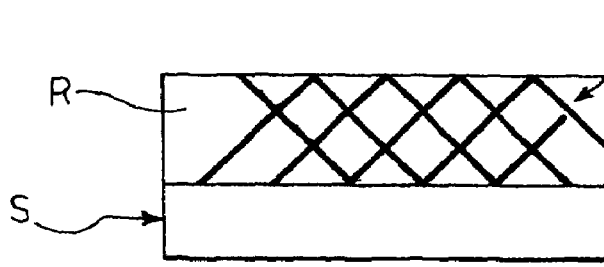
Figure 1E:
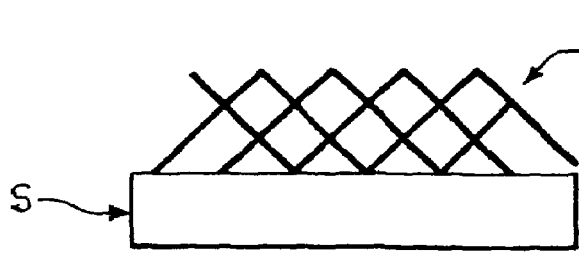
Figure 2A:
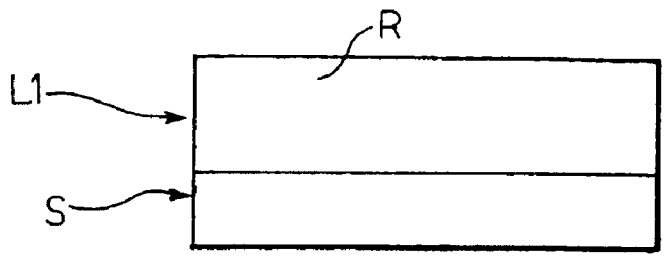
Figure 2B:
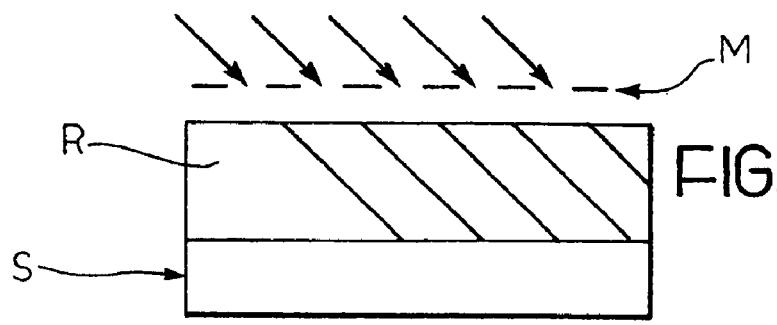
Figure 2C:
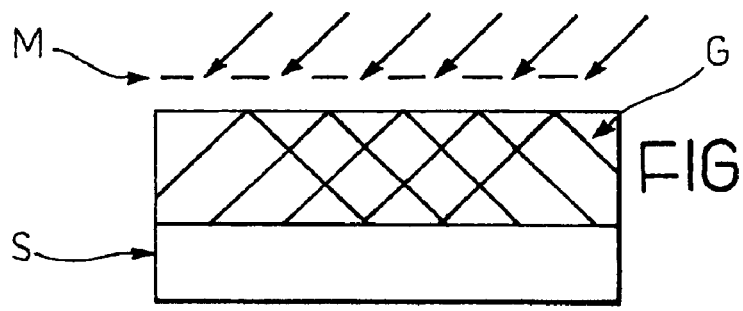
Figure 2D:
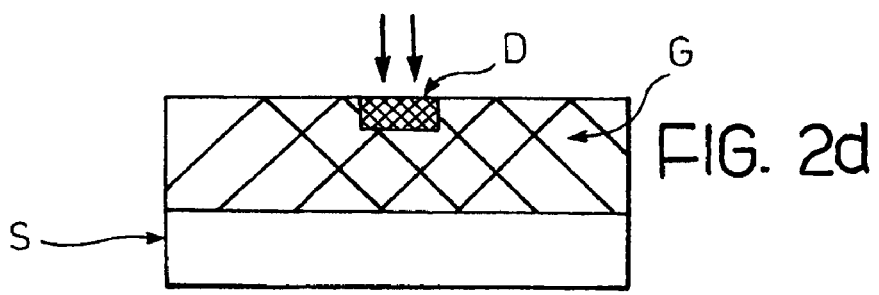
Figure 2E:
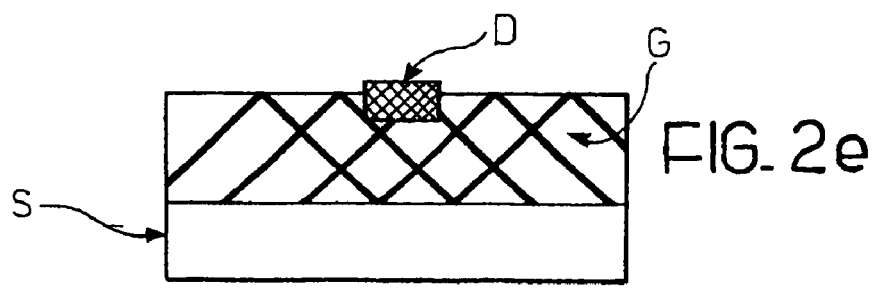
Figure 2F:
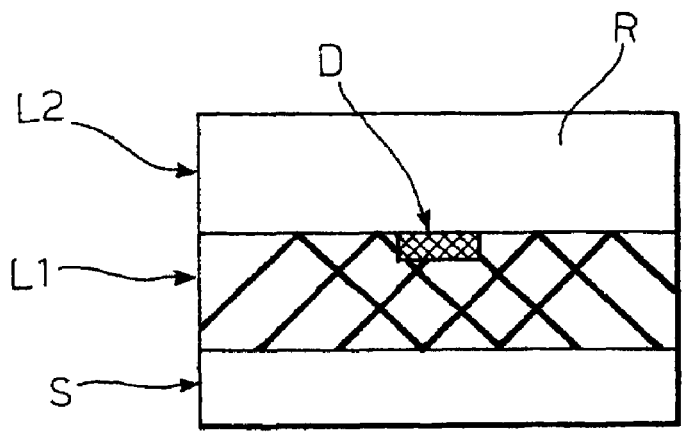
Figure 2G:
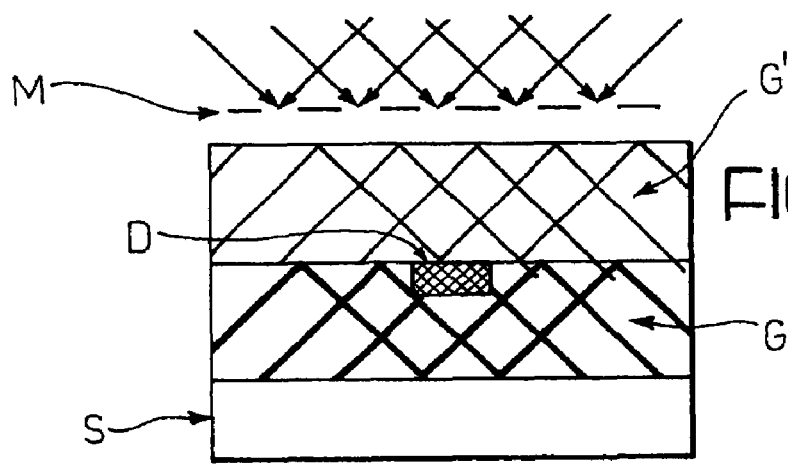
Figure 2H:
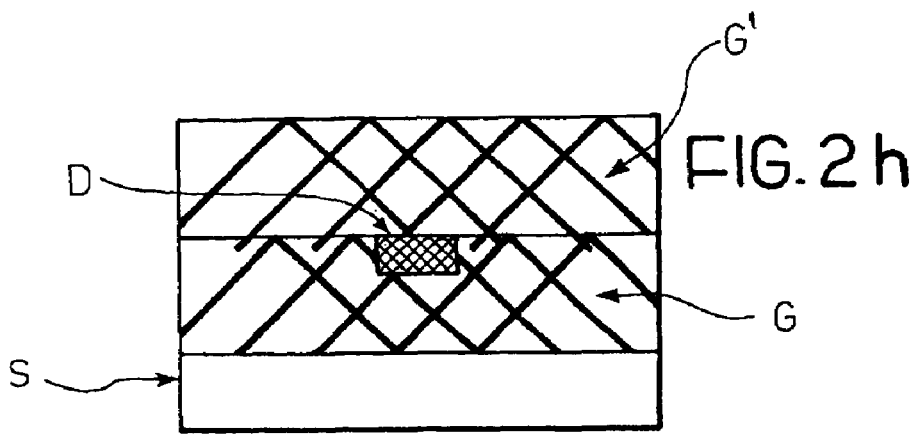
Figure 3A:
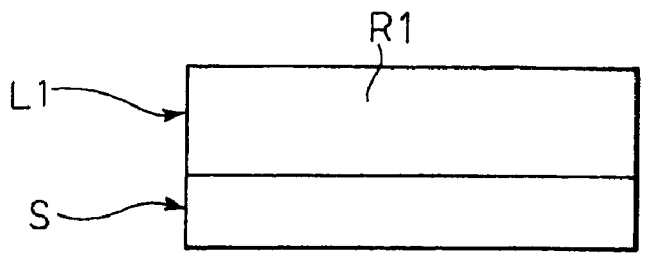
FIGS. 3a-3g show schematically the steps of fabrication of periodic three-dimensional nanostructures incorporating a defect by a method according to the invention.
Figure 3B:
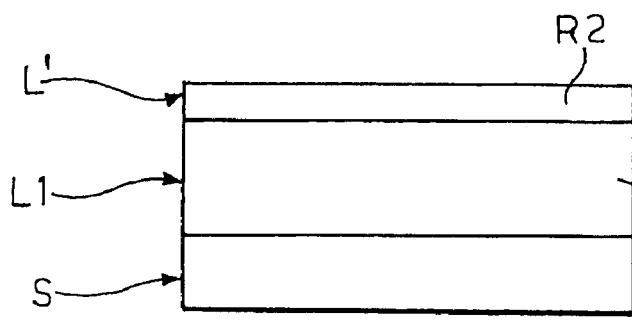

FIG. 3a shows the initial configuration, comprising a substrate S (silicon, for example) and a first layer L1 of a resist R1, which in this example is a high-resolution low-sensitivity positive resist such as PMMA (polymethyl methacrylate). The structure is substantially similar to that described in FIGS. 1a and 2a in the description of the prior art.

After the deposition of the layer L1 of PMMA, the prebaking process typical of PMMA is carried out. In the next step (FIG. 3b), a layer L' of a high-sensitivity negative resist R2, such as SAL601 or SAL602 produced by Shipley, is deposited, and the baking process for this second resist is carried out.

Figure 3C:
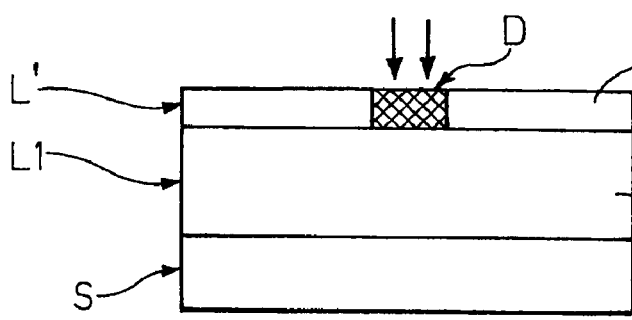
Figure 3D:
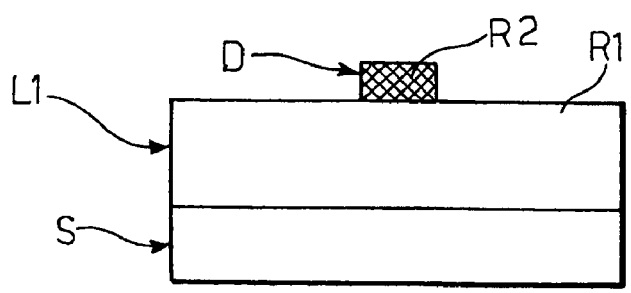

FIGS. 3c and 3d show the process of lithography of the negative resist R2 by the steps of exposure (FIG. 3c), development and removal (FIG. 3d) of the un-polymerized areas. In this example, the desired pattern is formed in the negative resist by electron beam lithography, but it can also be formed by optical or X-ray lithography (using masks in the latter cases). The pattern of the developed negative resist, obtained by mask formation or by scanning control in the case of electron beam lithography, represents the defect D in the periodic structure of the crystal under construction.

The resist forming the defect D is fully developed and substantially inert with respect to subsequent lithographic processes.

Since the sensitivity of SAL601 or SAL602 (R2) is much greater (by approximately two orders of magnitude) than that of PMMA (R1), the exposure dose of the SAL is so low that it leaves the underlying PMMA almost completely undisturbed. The development and subsequent removal of the unpolymerized SAL also take place without interference with the PMMA, which remains stable. Indeed, the lithographic process on the layer L' has no effect on the underlying layer L1.

The only cause of interference between the two resists is the mixing between the two in very thin layers (5-10 nanometres) at the interface. This mixed layer cannot be etched by the development of either the SAL601 or the PMMA, and must therefore be removed by chemical etching for a few seconds in a reactive plasma (oxygen gas, for example).

Figure 3E:
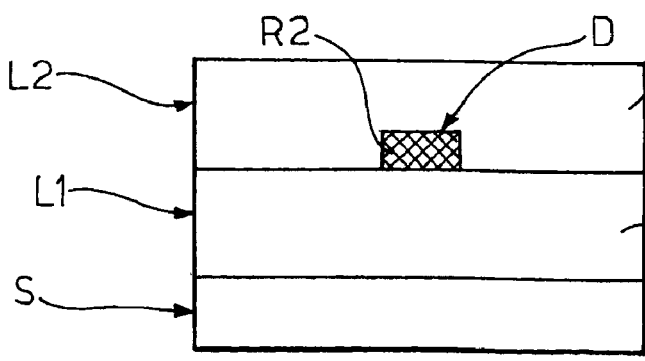

A further layer L2 of the positive PMMA resist (R1) is then deposited to provide the configuration of FIG. 3e, in which the defect D is completely embedded in a volume of PMMA.

Figure 3F:
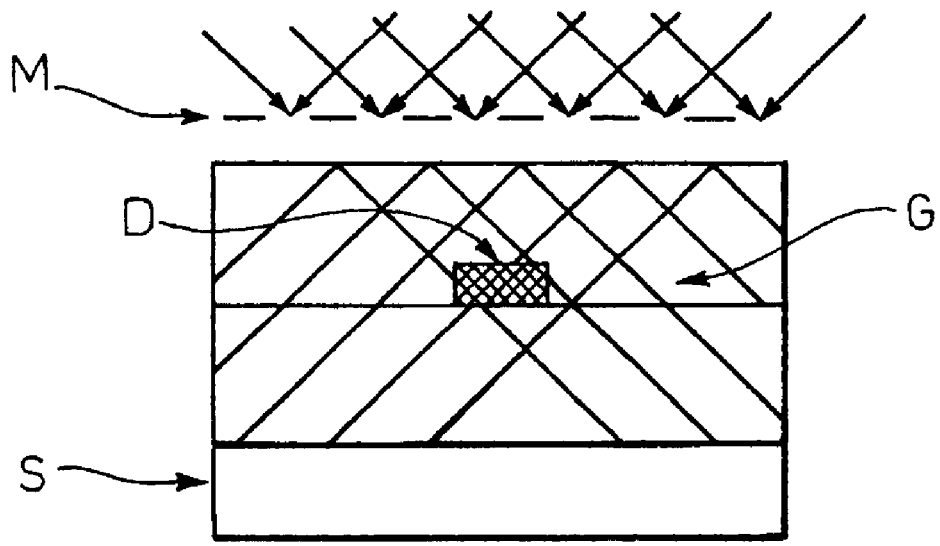
Figure 3G:
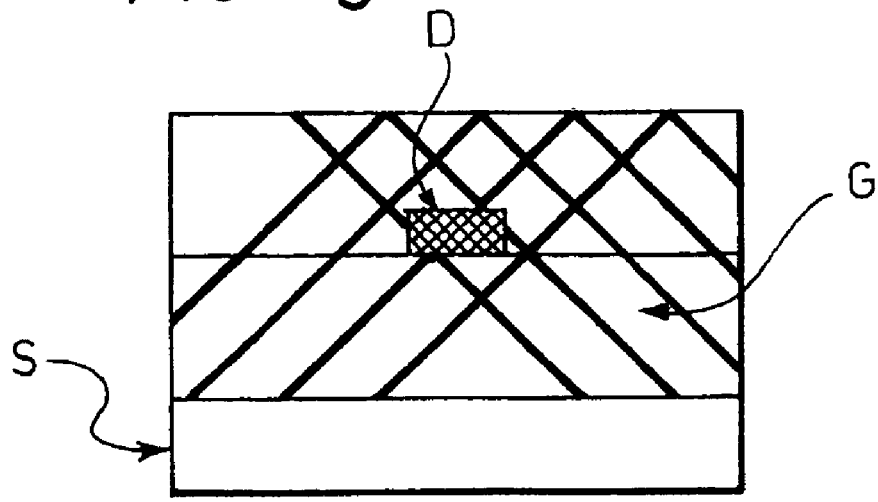

At this point, the structure of the photonic crystal can be formed in the PMMA by ultraviolet or X-ray lithography, according to the prior art. FIGS. 3f and 3g show the steps of the lithographic process with exposure of the structure to X-ray illumination through a mask M, the creation of a reticular structure G of unpolymerized PMMA, its removal (not shown) and the metallization of the hollow structure thus obtained.

It should be noted that in these last operations the X-ray lithographic process on the PMMA has no effect on the structure of the negative resist incorporated, which in fact becomes even more stabilized when further exposed. Moreover, SAL601 or SAL602 is a resist transparent to electromagnetic radiation, and therefore does not limit the exposure of the PMMA, even in the parts underlying the said SAL.

This is a fundamental aspect, since it makes it possible to provide PMMA structures self-aligned between the layers above and below the interface where the defect has been formed. The defect generated in the volume of the structure substantially acts as a point defect in mechanical and chemical terms, but not in optical terms, and therefore the X-rays in the PMMA lithography process penetrate into the whole volume of the PMMA.

The method according to the invention can be used to carry out lithography at the interface, defining the thickness, position and height above the substrate of defects that are to be created.

After the electrolytic growth, the PMMA and SAL601 or SAL602 can be removed in two separate steps, by dissolving the resists in corresponding solvents, thus producing a final three-dimensional metallic structure comprising a metallic periodic lattice G supported by the substrate S and having formed within it a line defect D, in this case a channel coplanar with the substrate.

The defect can usefully form a waveguide for an electromagnetic signal.

More generally, a defect can be a solid structure (a particle or wire) or a hollow structure (a hole or channel) within a periodic volume structure (a lattice or a matrix). It is also possible for the negative resist structure enclosed by the positive resist structure to have a degree of independence. This is the case, for example, in microfluidics applications, where a tubular micro-duct (of negative resist) is supported by two or more pillars (of positive resist).

The method may advantageously be repeated several times, with successive deposition of the resists R1 and R2. Thus, it is possible to design complex architectures at different levels, using parallel methods which are therefore well suited to mass production. In the case of the example cited above, it is possible to connect tubular micro-ducts at different levels, interconnected by mixing or filtering wells, enabling complex microfluidics circuits to be produced in a simple and practical way.

Lattice G may also be formed by infiltrating a high refraction index material (dielectric or semiconductor with refraction index greater than 2) into the hollow reticular structure obtained within the resist R1. Infiltration of the high refraction index material in general may be carried out by chemical deposition from the vapour phase or liquid phase. In particular infiltration can be performed by impregnation of SOL-GEL, by the reaction of compound semiconductor formation after the impregnation with constituent precursors or by electrolytic growth of semiconductors.

Conveniently, the defect structures generated with the SAL can be aligned with those produced with the PMMA, and the overall structure can be made autonomous, in other words independent of the presence of a mechanical substrate.

This can be done by modifying the configuration described above, according to which the mask for the X-ray lithography of the PMMA is joined to the latter on the opposite side from the substrate on which the volume of PMMA has been deposited.

This is because it is possible to use the said mask as a mechanical substrate and to deposit on it the volume of PMMA required to form the structure, again following the steps described above. The PMMA will therefore be exposed from below. Since the mask is joined to the PMMA structure, the pattern of the mask will be perfectly aligned with the pattern applied through it to the PMMA. The pattern on the mask can be supplemented with spatial references, external to the desired pattern of the PMMA, which make it possible to define a reference system common to the two forms of lithography, namely X-ray and electron beam, and therefore to control the electron beam lithography of the SAL and the X-ray lithography of the PMMA on the basis of these references, thus producing a final structure in which the defect incorporated in the PMMA matrix is precisely aligned with the periodic structure of the PMMA which incorporates it, or with any other defects that may be present.

It would also be possible to apply the method to pre-defined structures. By contrast with the above technical description, the first layer of PMMA could be pre-configured, for example by means of non-high-resolution structures. The subsequent configuration of the SAL would thus be modulated in the vertical direction by the pre-existing configuration of the PMMA. Thus, when the second layer of PMMA has been deposited and the whole matrix has been lithographed, it is possible to obtain three-dimensional SAL structures enclosed within a three-dimensional matrix of PMMA.

The basic characteristic of the process illustrated above is the combination of a low-sensitivity positive resist with a high-sensitivity negative resist. In this case, the differing sensitivity and the virtually total independence of the two resists with respect to the corresponding developers and solvents have been exploited. Clearly, in more general ways, the method proposed by the invention can be carried out by using a pair of resists which are both negative or both positive, or alternatively by using a negative resist for the volume patterning of the crystal, followed by a positive resist for forming the defects. An example of a positive resist which can be used in place of SAL601 or SAL602 is UV3 (also produced by Shipley).

The process can therefore be extended to a combined use of different forms of lithography. In the case indicated, the combination of X-ray and electron beam lithography was used, but it is equally possible to use only X-ray lithography or only electron beam lithography, or to combine other forms of lithography such as optical lithography in the various wavelength ranges and methods (in particular holographic optical lithography), or ion beam lithography. In other words, the essence of the invention consists in the independence of the two resists used and is independent of the nature of the incident radiation.

As a further generalization, it should be noted that the method described above can be used in all cases, provided that a condition of chemical independence of the pair of resists is present, in other words provided that the exposure and development processes of the resists used have characteristics of mutual incompatibility, so that the lithography of one resist does not modify the structure of the other (in other words, does not cause its development). This can be done, for example, by using resists which have different sensitivities or which are sensitive to different irradiation wavelengths, or which can be etched by different chemical reagents in the lithographic process.

Clearly, provided that the principle of the invention is retained, the embodiments and the details of implementation can be varied widely from what has been described and illustrated purely by way of non-limitative example, and such variation shall not imply departure from the scope of protection as defined by the attached claims.

What is claimed is:

1. Lithographic method for fabricating three-dimensional structures on the micrometric and submicrometric scale, including the operations of:
   providing a substrate;
   depositing on the said substrate a first layer of a first polymeric material sensitive to exposure to charged particles or to electromagnetic radiation;
   depositing, on the first layer of the first material, a layer of a second polymeric material sensitive to exposure to charged particles or to electromagnetic radiation in a different way from the first material, so that the processes of exposure and development of the two materials are mutually incompatible to the extent that the exposure or development of one of the materials does not interfere with the exposure and development of the other material;
   forming a pattern on the second material by a litho-graphic process, comprising the steps of:
      exposing the layer of the second material to charged particles or electromagnetic radiation according to a predetermined topography so as to define a first and a second portion of the layer of the second material, respectively exposed and unexposed to the said particles or to the said radiation; and
      subsequently selectively removing one of said first and second portions of the layer of the second material, so that regions of the first layer of the first material are left uncovered;
   depositing, on the patterned layer of the second material and on the uncovered regions of the first layer of the first material, a second layer of the first material; and
   forming a pattern on the first and second layers of the first material by a litho-graphic process, comprising the steps of:
      exposing the first and second layers of the first material to charged particles or electromagnetic radiation according to a predetermined topography so as to define a first and a second portion of the first and second layers of the first material, respectively exposed and unexposed to the said particles or to the said radiation;
      subsequently, selectively removing one of said first and second portions of the first and second layers of the first material,
   wherein the second material is transparent to the particles or to the electromagnetic radiation to which the first material is sensitive.

2. Method according to claim 1, comprising the iteration of the steps of:
   depositing a further layer of the second material on the second layer of the first material;
   forming a pattern of the further layer of the second material by lithography; and
   depositing a third layer of said first material on the patterned layer of the further layer of the second material, before the lithographic forming of the pattern of the first material.

3. Method according to claim 1, wherein the first polymeric material is a positive resist and the second polymeric material is a negative resist.

4. Method according to claim 1, wherein the first polymeric material is a low-sensitivity resist and the second polymeric material is a high-sensitivity resist.

5. Method according to claim 1, wherein the lithographic process for forming the pattern of the first material is an X-ray or optical lithography process, and the lithographic process for forming the pattern of the second material is an electron beam lithographic process.

6. Method according to claim 5, wherein the lithographic forming of the pattern of the first material creates a hollow periodic structure within the volume of the first material, and the lithographic forming of the pattern of the second material creates a solid irregular structure within the volume of the first material.

7. Method according to claim 6, further comprising a step of infiltrating metallic and/or high refraction index material, such as dielectric or semiconductor with refraction index greater than 2, into the said hollow periodic structure, followed by an operation of removing the said first and second material which has been developed.

8. Method according to claim 7, wherein the step of infiltrating high refraction index material is an electrolytic growth step.

9. Method according to claim 7, wherein the step of infiltrating dielectric material is a step of chemical deposition from the vapour phase or liquid phase.

10. Method according to claim 7, wherein the step of infiltrating high refraction index material is a step of infiltration by the sol-gel process.

11. Method according to claim 1, wherein a layer of the first material is patterned before a layer of the second material is deposited on it.

12. Method according to claim 1, wherein the said substrate is a mask for patterning the said first material.

13. Method according to claim 12, wherein the said mask for patterning the first material includes reference information of a spatial reference system for alignment in the lithographic forming of the patterns of the first and second materials.

* * * * *